United States Patent
Nam et al.

(10) Patent No.: US 11,171,495 B2
(45) Date of Patent: Nov. 9, 2021

(54) BATTERY PACK HAVING COMMUNICATION TERMINAL ISOLATION FUNCTION

(71) Applicant: LG CHEM, LTD., Seoul (KR)

(72) Inventors: Ho Chol Nam, Cheongju-si (KR); Dong Hyun Kim, Sejong (KR); Hak In Kim, Cheongju-si (KR)

(73) Assignee: LG CHEM, LTD., Seoul (KR)

( * ) Notice: Subject to any disclaimer, the term of this patent is extended or adjusted under 35 U.S.C. 154(b) by 132 days.

(21) Appl. No.: 16/479,751

(22) PCT Filed: Sep. 11, 2018

(86) PCT No.: PCT/KR2018/010582
§ 371 (c)(1),
(2) Date: Jul. 22, 2019

(87) PCT Pub. No.: WO2019/054712
PCT Pub. Date: Mar. 21, 2019

(65) Prior Publication Data
US 2019/0363549 A1    Nov. 28, 2019

(30) Foreign Application Priority Data

Sep. 15, 2017    (KR) ........................ 10-2017-0118635

(51) Int. Cl.
*H02J 7/00*      (2006.01)
*G01R 31/3835*      (2019.01)
(Continued)

(52) U.S. Cl.
CPC ........ *H02J 7/0014* (2013.01); *G01R 31/3835* (2019.01); *H01M 10/4257* (2013.01);
(Continued)

(58) Field of Classification Search
CPC .... H02J 7/0014; H02J 7/0029; H02J 7/00302; H02J 7/00304; H02J 7/00306;
(Continued)

(56) References Cited

U.S. PATENT DOCUMENTS

2011/0057622 A1    3/2011   Kim
2011/0140662 A1*   6/2011   Li ........................ H02J 7/0019
                                                                  320/116

(Continued)

FOREIGN PATENT DOCUMENTS

EP    2 421 112 A2    2/2012
JP    9-56058 A    2/1997
(Continued)

OTHER PUBLICATIONS

Extended European Search Report for European Patent Application No. 18857174.9 dated Mar. 18, 2020.
(Continued)

*Primary Examiner* — M Baye Diao
(74) *Attorney, Agent, or Firm* — Birch, Stewart, Kolasch & Birch, LLP

(57) ABSTRACT

A battery pack including a communication terminal insulation function with an external system connected to the battery pack and a control method thereof.

7 Claims, 2 Drawing Sheets

(51) Int. Cl.
*H01M 10/42* (2006.01)
*H01M 10/48* (2006.01)

(52) U.S. Cl.
CPC ......... *H01M 10/482* (2013.01); *H02J 7/0026* (2013.01); *H01M 2010/4271* (2013.01); *H01M 2220/30* (2013.01)

(58) Field of Classification Search
CPC ...... H02J 7/00308; H02J 7/00309; H02J 7/00; G01R 31/3835; G01R 31/36; H01M 10/4257; H01M 10/482; H01M 2010/4271; H01M 2220/30; H01M 2200/00; H01M 10/44; H01M 10/425; Y02E 60/10
USPC .......................................................... 320/134
See application file for complete search history.

(56) References Cited

U.S. PATENT DOCUMENTS

| | | | |
|---|---|---|---|
| 2012/0032641 A1* | 2/2012 | Yun | H02J 7/0047 320/118 |
| 2012/0139494 A1 | 6/2012 | Kim | |
| 2014/0103876 A1 | 4/2014 | Kim et al. | |
| 2014/0266051 A1 | 9/2014 | Hayakawa | |
| 2016/0156211 A1* | 6/2016 | Sundaraaman | H02J 7/00 320/112 |
| 2016/0359345 A1* | 12/2016 | Uesugi | H02J 7/00047 |

FOREIGN PATENT DOCUMENTS

| | | | | |
|---|---|---|---|---|
| JP | 2007-109444 A | | 4/2007 | |
| JP | 2007-215251 A | | 8/2007 | |
| JP | 2008-43009 A | | 2/2008 | |
| JP | 2009-117262 A | | 5/2009 | |
| JP | 2013-230037 A | | 11/2013 | |
| JP | 2016-214072 A | | 12/2016 | |
| KR | 10-2007-0105219 A | | 10/2007 | |
| KR | 10-2007-0105220 A | | 10/2007 | |
| KR | 20070105220 A | * | 10/2007 | ............ H02J 7/0031 |
| KR | 10-2007-0109084 A | | 11/2007 | |
| KR | 10-2011-0026674 A | | 3/2011 | |
| KR | 10-2012-0013775 A | | 2/2012 | |
| KR | 10-1124511 B1 | | 3/2012 | |
| KR | 10-2012-0059852 A | | 6/2012 | |
| KR | 10-2014-0082730 A | | 7/2014 | |
| KR | 20160132691 A | * | 11/2016 | ................ H02J 7/34 |
| KR | 10-2017-0021120 A | | 2/2017 | |
| KR | 10-2017-0051062 A | | 5/2017 | |

OTHER PUBLICATIONS

International Search Report issued in PCT/KR2018/010582 (PCT/ISA/210), dated Dec. 20, 2018.

\* cited by examiner

[FIG. 2]
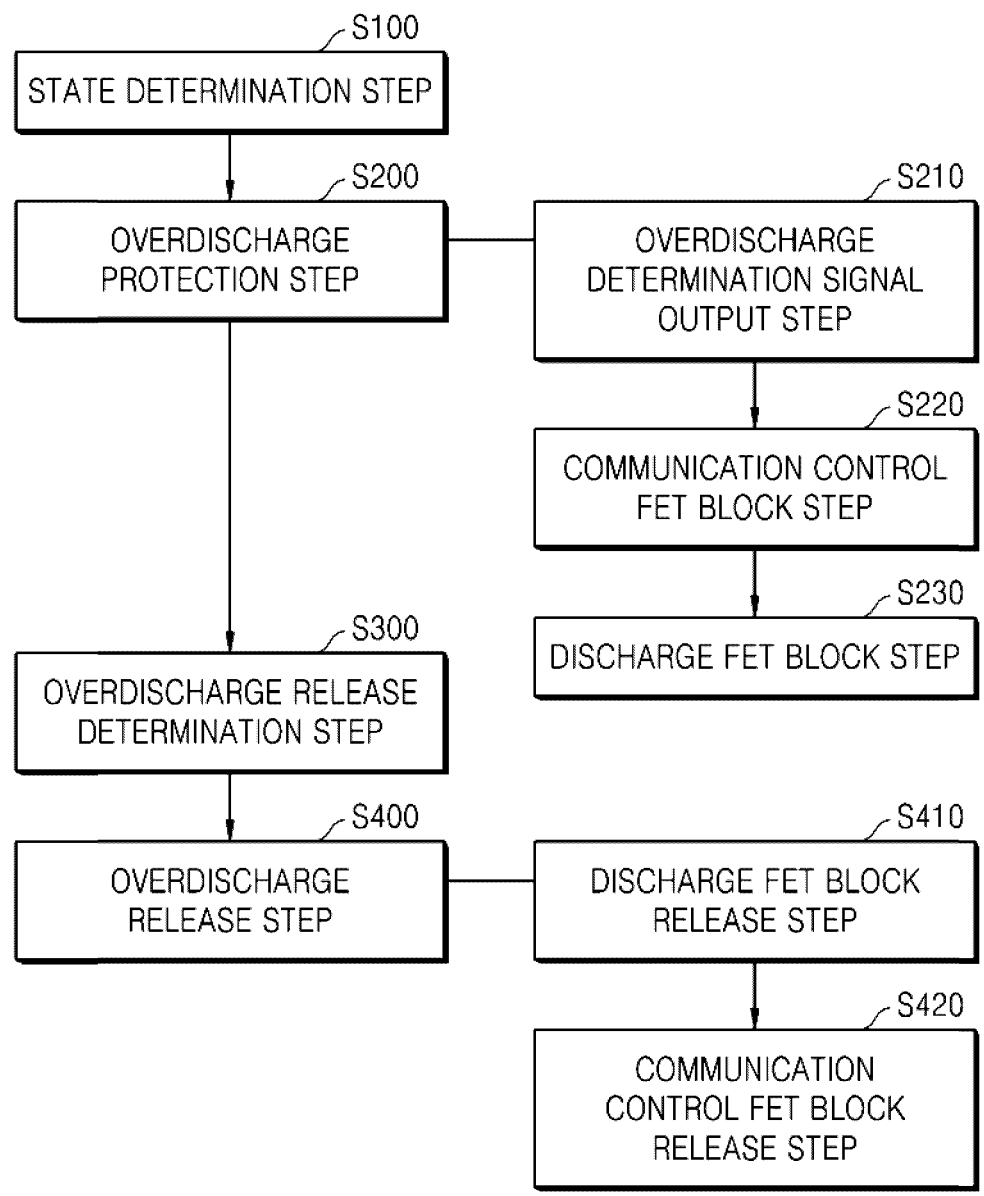

BATTERY PACK HAVING COMMUNICATION TERMINAL ISOLATION FUNCTION

TECHNICAL FIELD

The present invention relates to a battery pack, and more particularly, to a battery pack including a communication terminal insulation function with an external system connected to the battery pack.

BACKGROUND ART

Generally, various portable electronic devices (hereinafter, referred to as 'external systems') including a notebook computer, a mobile phone, and a camera are equipped with a battery pack including a plurality of battery cells capable of charge and discharge.

The battery pack is provided with an external terminal including a communication stage. The battery pack is connected to an external system through which the battery cells included in the battery pack are charged and discharged, and are communicated with the external system.

On the other hand, if the communication terminal to which the battery pack and the external system are communicatively connected is not insulated, in a case where the protection operation of the battery pack, specifically, the flow of the discharge current is blocked, a surge current is generated, and the generated surge current may flow into the external system through the communication terminal, which may adversely affect the external system.

In addition, this may destroy the microcomputer unit (MCU) which flows into the battery pack through the communication terminal as well as the external system to perform the overall control function of the battery pack, and therefore, there arises a problem in controlling the normal operation of the battery pack, which results in a safety problem of the battery pack.

In order to prevent such a problem from occurring, the communication terminal between the battery pack and the external system must be insulated, but for this, since separate components to perform the isolation function, for example an Isolator IC, must be additionally configured to ensure that the terminals are isolated, there is a problem that extra cost is incurred due to the additional parts.

DISCLOSURE OF THE INVENTION

Technical Problem

The present invention is to provide a method capable of performing communication isolation processing without incurring any additional costs.

Technical Solution

In accordance with an exemplary embodiment, a battery pack includes: a cell balancing unit for balancing a plurality battery cells; an analog front end (AFE) for monitoring a voltage state of each of the battery cells and controlling the cell balancing unit; a microcomputer unit (MCU) for controlling the AFE based on a voltage state of each battery cell monitored by the AFE; and an external terminal connected to the battery pack and an external system.

The external terminal may include: an output terminal for allowing a current to flow between the battery cell and the external system; and a communication terminal for enabling communication between the MCU and the external system.

The battery pack may further include: a charge field effect transistor (FET) for blocking current flow from the output terminal to the battery cell; and a discharge FET for blocking current flow from the battery cell to an output terminal, which are configured on a current path between the battery cell and the output terminal.

The charge FET and the discharge FET may be turned on/off by the AFE.

A communication path may be formed between the MCU and the communication terminal, and a communication control FET for blocking a path between the communication terminal and the MCU under a control of the MCU may be configured on the communication path.

The MCU may include: an overcharge determination unit for generating an overcharge determination signal and outputting the overcharge determination signal to the AFE, when it is determined that the battery cell is overcharged; an overdischarge determination unit for generating an overdischarge determination signal and outputting the overdischarge determination signal to the AFE, when it is determined that the battery cell is overdischarged; and a communication control FET block unit for detecting that the overdischarge determination signal outputted from the overdischarge determination unit and outputting a communication control FET off signal to the communication control FET to block a current flow between the MCU and the communication terminal.

When an overcharge determination signal is inputted from the MCU, the AFE may output a charge FET off signal to block a flow of a charge current, and when the overdischarge determination signal is inputted, the AFE may output a discharge FET off signal to block a flow of a discharge current.

The discharge FET off signal may be outputted after a predetermined time after the communication control FET off signal is outputted.

In accordance with an exemplary embodiment, a method of controlling a battery pack including battery cells, the method comprising: a state determination step of monitoring a voltage state of each battery cell to determine an overcharge or overdischarge state of battery cells, wherein when it is determined that the battery cells are overdischarged in the state determination step, an overdischarge protection step is operated, wherein the overdischarge protection step includes: an overdischarge determination signal output step of outputting an overdischarge determination signal to an AFE to block a flow of a discharge current; a communication control FET block step of blocking a communication control field effect transistor (FET) configured on a communication path between the battery pack and an external system; and a discharge FET block step of blocking a flow of a discharge current from the battery cells to an external terminal.

The method may further include, after the operation of the overdischarge protection step, an overdischarge release determination step of monitoring the voltage state of each battery cell to determine whether overdischarge of battery cells is released, wherein when it is determined that the overdischarge state of the battery cells is released, an overdischarge release step of releasing an overdischarge protection state of the battery cells may be operated, wherein the overdischarge release step may include: a discharge FET block release step of generating and outputting a FET on signal to release the discharge FET block; and a communication control FET block release step of generating and outputting the communication control FET on signal to release the communication control FET block, wherein the communication control FET block release step may be operated a predetermined time after the discharge FET block release step is operated.

The discharge FET block step may be operated a predetermined time after the communication control FET block step is operated.

Advantageous Effects

The present invention is advantageous in that it may be applied to a low-cost product because it does not incur any additional cost by enabling a communication terminal insulation process using a circuit generally constituted in a battery pack.

In addition, the MCU of the battery pack may be protected so that it may provide improved stability of the battery pack.

BRIEF DESCRIPTION OF THE DRAWINGS

FIG. 2 is a block diagram showing a method of controlling a battery pack according to the present invention.

DETAILED DESCRIPTION OF EMBODIMENTS

Figure 1:
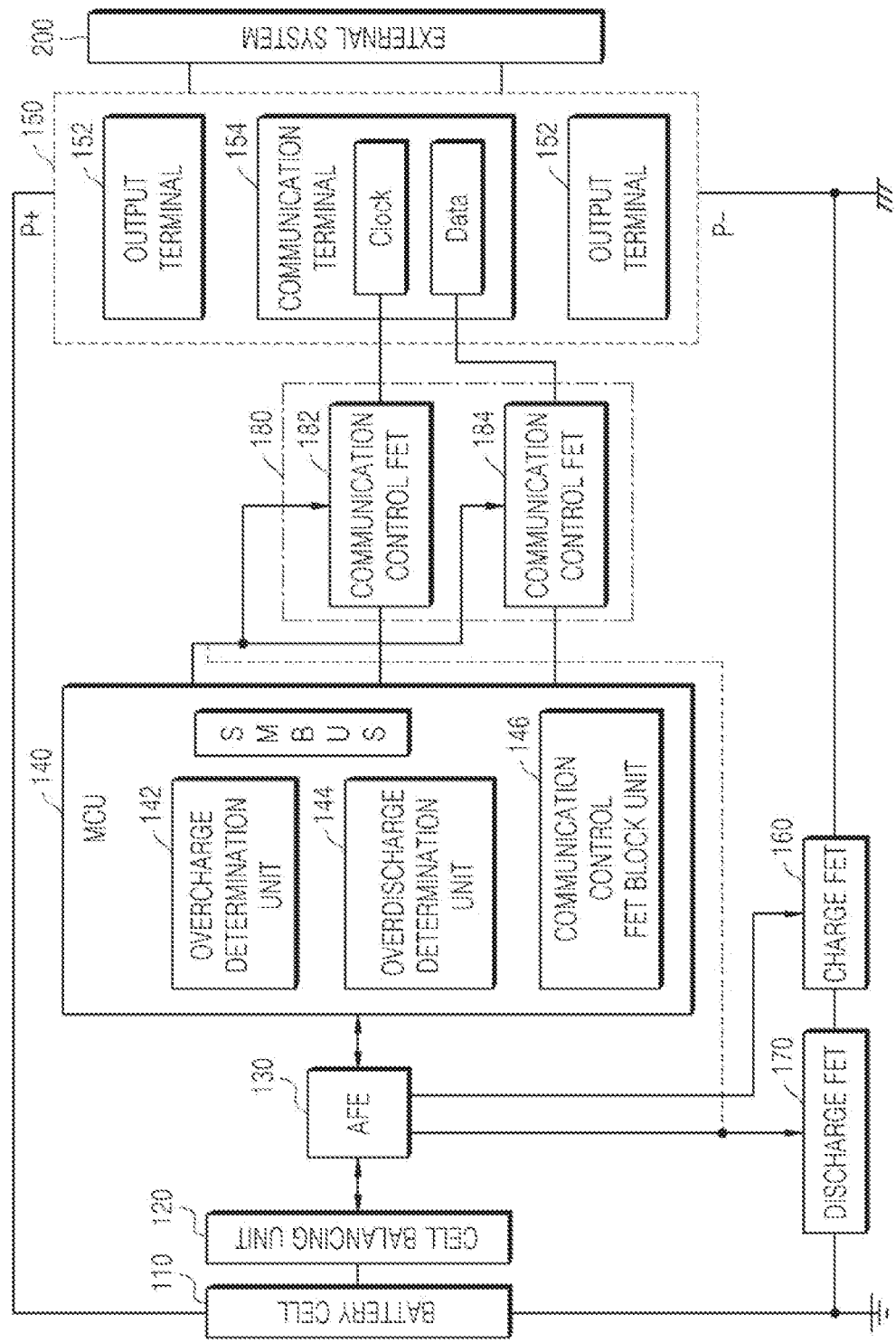
FIG. 1 is a circuit diagram showing a configuration of a battery pack according to the present invention.

Hereinafter, embodiments of the present invention will be described in detail with reference to the accompanying drawings so that those skilled in the art may easily carry out the present invention. The present invention may, however, be embodied in different forms and should not be construed as limited to the embodiments set forth herein. Parts not relating to description are omitted in the drawings in order to clearly describe the present invention and like reference numerals refer to like elements throughout.

Although the terms "initial," "second," etc., may be used herein to describe various elements, these elements should not be limited by these terms. The above terms are used only to distinguish one component from another. For example, an initial component may be referred to as a second component and vice versa without departing from the scope of the present invention. Terms used in this specification are used to describe specific embodiments, and are not intended to limit the scope of the present invention. The singular expressions include plural expressions unless the context clearly dictates otherwise.

Throughout the specification, when a portion is referred to as being "connected" to another portion, it includes not only "directly connected" but also "electrically connected" with another element therebetween. Furthermore, when it is described that one comprises (or includes or has) some elements, it should be understood that it may comprise (or include or has) only those elements, or it may comprise (or include or have) other elements as well as those elements if there is no specific limitation. The term "~ing operation" or "operation of ~ing" used throughout the specification does not mean "operation for ~ing".

Terms used in this specification may be currently widely used general terms in consideration of functions in the present invention but may vary according to the intents of those skilled in the art, precedents, or the advent of new technology. Additionally, in certain cases, there may be terms the applicant selects arbitrarily and in this case, their meanings are described in a corresponding description part of the present invention. Accordingly, terms used in the present invention should be defined based on the meaning of the term and the entire contents of the present invention instead of the simple term name.

Hereinafter, the present invention will be described in detail with reference to the drawings, and in the following description, the analog front end will be referred to as an abbreviation "AFE" and the microcomputer unit will be referred to as an "MCU" for the sake of convenience.

FIG. 1 is a circuit diagram briefly showing a configuration of a battery pack according to the present invention.

Referring to FIG. 1, a battery pack 100 includes a battery cell 110, a cell balancing unit 120, an AFE 130, an MCU 140, an external terminal 150, a charge FET 160, a discharge FET 170, and a communication control FET 180.

Here, the external terminal 150 is configured to connect the battery pack 100 and the external system 200, and the external system 200 may be, for example, a device capable of attaching/detaching a battery pack, such as a notebook computer, a mobile phone, and a camera.

Accordingly, the battery cells 110 may be charged or discharged through the external terminal 150 by connecting a power supply device such as an adapter (charge unit) or an external load device to the external system 200.

Such an operation will be described in detail in the description of the external terminal 150.

Here, the AFE and the MCU may be an integrated circuit.

The battery cell 110 is charged and discharged under the control of the MCU 140, and although shown as a block in the drawings for the sake of convenience, the battery cell 110 may include one or more battery cells connected in series or in parallel.

The cell balancing unit 120 may be connected to the plurality of battery cells 110 to perform cell balancing. The cell balancing unit 120 may perform balancing so that the voltages of the battery cells 110 are balanced by the AFE 130, and more precisely, may perform the balancing operation under the control of the MCU 140 that controls the operation of the AFE 130 as a whole.

Here, the cell balancing unit 120 may include a voltage sensing unit connected to each of the battery cells 110 to sense a voltage, or may have a separate configuration. The voltage sensing unit (not shown) may sense the voltage of each battery cell 110 and provide the information to the AFE 130, which will be described later.

The AFE 130 may periodically receive the voltage information of each of the sensed battery cells 110 to monitor the voltage state of the battery cells 110.

Also, the AFE 130 transmits information on the voltage state of the monitored battery cells 110 to the MCU 140, and in response to the control command of the MCU 140 that receives the information, the AFE 130 may operate the cell balancing unit 120 to turn on and off the charge FET 160 and the discharge FET 170 and balance the voltages of the battery cells 110.

In other words, as shown in the drawings, the AFE 130 is configured between the battery cells 110/the cell balancing unit 120 and the MCU 130 so that it operates the charge and discharge FETs 160 and 170 and the cell balancing unit 120 under the overall control of the MCU 130.

As described above, the MCU 140 receives information on the voltage state of the battery cells 110 from the AFE 130 and controls charge and discharge and cell balancing operations of the battery cells 110 based on the information.

More precisely, the MCU 140 provides control signals/commands to perform charge and discharge and cell balancing operations according to the voltage state of battery cells 110, and the AFE 130 receiving the control signal/ command operates the charge FET 160, the discharge FET 170 and the cell balancing unit 120 in response to the control signal/command.

The MCU 140 may compare the voltage state of each battery cell 110 received from the AFE 130 with a predetermined determination value to determine whether the battery cell 110 is overcharged or overdischarged. It may be configured including an overcharge determination unit 142 for, if the voltage of the battery cell 110 is equal to or higher than the predetermined overcharge determination value, determining it as an overcharge state, generating an overcharge determination signal corresponding thereto, and outputting the overcharge determination signal to the AFE 130.

In addition, it may be configured including an overdischarge determination unit 144 for, if the voltage of the battery cell 110 is equal to or less than the predetermined overcharge determination value, determining it as an overdischarge state, generating an overdischarge determination signal corresponding thereto, and outputting the overdischarge determination signal to the AFE 130.

Therefore, if an overcharge determination signal is inputted, in order to prevent further charging current from entering the battery pack, the AFE 130 may turn off the charge FET 160, and if an overdischarge determination signal is inputted, the AFE 130 may turn off the discharge FET 170 to block the flow of the discharge current of the battery pack.

Also, the MCU 140 may communicate with the external system 200 and the battery pack 100. The MCU 140 may communicate with an external system 200 connected to an external terminal 150 through an SMBUS formed therein, and for example, the MCU 140 transmits cell data such as a voltage state of the battery cells 110 received from the AFE 130 to the external system 200 through a communication path formed between the MCU 140 and the external terminal 150.

At this time, the cell data may be transmitted from the SMBUS to the external system 200 in synchronization with the clock signal CLK of the communication terminal through the communication paths (first and second paths).

On the other hand, the MCU 140 may be configured including a communication control FET block unit 146 for controlling on/off of the communication control FET 180 formed in the communication path between the MCU 140 and the communication terminal 154 of the external terminal 150. This will be described in detail in the description of the communication control FET 180.

Meanwhile, the external terminal 150 may be configured including an output terminal 152 and a communication terminal 154, as shown in the drawing.

The output terminal 152 may be charge and discharge paths with an external system 200 that allows the battery cells 110 to be charged and discharged. That is, current flows through each path between the battery cells 110 and P+ and P− of the output terminal 150, so that the battery cells 110 may be charged and discharged. That is, this path may be described as a charge/discharge path.

For example, when an adapter (charge unit) for supplying the voltage is connected to the external system 150 connected to the external terminal 150 of the battery pack 100, a charge current flows through the output terminal 152 so that the battery cells 110 are charged.

On the other hand, when the external system 150 and the adapter (charge unit) are separated and connected to the external load, a current flows from the battery cells 110 to the external load of the external system 200 through the output terminal 152 of the external terminal 150, so that the battery cells 110 are discharged.

At this time, the charge FET 160 and the discharge FET 170 are configured on the charge/discharge path formed between the battery cells 110 and the output terminal 152, and as described above, under the control of the MCU 140, the AFE 130 turns on/off the charge FET 160 and the discharge FET 170 so that the charge and discharge operations of the battery cells may be controlled.

That is, as described above, when the MCU 140 outputs an overcharge determination signal, the AFE 130 outputs an off signal to the charge FET 160 to block the charge current from flowing into the battery cells 110 from the adapter (charge unit) of the external system 200, and when an overdischarge determination signal is outputted from the MCU 140, the AFE 130 outputs an off signal to the discharge FET 170 to block the flow of the current from the battery cells 110 to the external load of the external system 200, that is, the flow of the discharge current.

Also, when the overcharge state of the battery cells is released, the charge FET 160 is turned on, and when the overdischarge state is released, the battery cells are allowed to be charged and discharged through control to turn on the discharge FET 170.

Here, the charge FET 160 and the discharge FET 170 are connected on a single path, and the direction of current flow is opposite to each other, thereby limiting the flow of charge and discharge current.

On the other hand, the communication terminal 154 may be a path for the MCU 140 to transmit data of the battery cells 110 to the external system 200, for example, voltage state information and the like.

A communication path for communication of the external system 200 is formed between the MCU 140 and the communication terminal 154, and the data of the battery cells 110 may be transferred from the MCU 140 to the external system 200 through the communication path of the external system 200 connected thereto.

At this time, the communication control FET 180 for blocking the current flow from the communication terminal 154 to the MCU 140 may be configured on the communication path between the MCU 140 and the communication terminal 154.

More specifically, as shown in the drawing, the first and second paths may be respectively connected to the Clock (C) terminal and the Date (D) terminal of the communication terminal 154, and the communication control FET 180 may be configured with a first communication control FET 182 and a second communication control FET 184, which are configured on the first and second paths, respectively. Each of the first and second communication control FETs 182 and 184 is controlled in the same state through one signal from the MCU 140, and for convenience of explanation, they will be described as the communication control FET 180 in the following description. The communication control FET 180 may be on/off controlled by the communication control FET block unit 146 of the MCU 140 described above.

More specifically, when an overdischarge determination signal is outputted from the overdischarge determination unit 144, the communication control FET block unit 146 may sense this and generate a communication control FET off signal and output it to the communication control FET 180. Accordingly, the communication control FET 180 is controlled to be off so that the current flow between the MCU 140 and the communication terminal 154 may be blocked.

At this time, as the overdischarge determination signal is generated and outputted, the AFE 130 outputs a discharge FET off signal for blocking the flow of the discharge current, so that the communication control FET off signal is outputted a predetermined time earlier than the discharge FET off signal.

For example, although not shown separately in the drawings, a configuration such as a delay buffer is arranged between the AFE 130 and the discharge FET 170 to output a communication control FET off signal, and after a predetermined time delay, a discharge FET off signal may be outputted to the discharge FET, or to generate an overdischarge determination signal in the MCU 140 and to output the overdischarge determination signal to the AFE 130 after a predetermined period of time, so that a communication control FET off signal may be outputted first. The present invention is not limited to one specific method, and the discharge FET 170 may be implemented in various manners that the communication control FET 180 may be shut off after a predetermined time after it is first interrupted.

In such a way, the communication control FET 180 is configured to be controlled in the same state as the discharge FET 170, so that it is possible to prevent the dangerous situation that the surge current generated when the discharge current flow is blocked flows into the battery pack through the communication path and destroys the MCU 140.

Although not described above, when the overdischarge state is released, that is, when the off-state discharge FET 170 and the communication control FET 180 are turned on, the two FETs are controlled in the same state, and the order is controlled in the order of the discharge FET 170→the communication control FET 180, which is inverse to the overdischarge state. This will be described in detail in the following description of the operation step.

Here, the predetermined time may be set to, for example, 250 ms.

FIG. 2 is a block diagram showing operation steps of a control circuit of a battery pack according to the present invention.

First, a state determination step (S100) for monitoring the voltage state of each battery cell and determining the overcharge or overdischarge state of the battery cells is operated. As described with reference to FIGS. 1 and 2, as the AFE 130 monitors the voltage state of each battery cell and transfers information on it to the MCU 140, the MCU 140 may determine whether the battery cells 110 are overcharged or overdischarged using the preset overcharge determination value and the overdischarge determination value.

As described above, if the MCU 140 determines that the battery cell 110 is overdischarged, an overdischarge protection step S200 for performing a protection operation of the battery cell for the overdischarge operates.

The overdischarge protection step S200 may operate in the order of an overdischarge determination signal output step S210, a communication control FET block step S220, and a discharge FET block step S230.

More specifically, if it is determined through the state determination step S100 that the battery cells are in the overdischarge state, in order to prevent the battery cells from being discharged, an operation for blocking current from flowing from the battery cells 110 to the output terminal 152, that is, the external load of the external system 200, must be performed. Therefore, if the MCU 140 determines that the battery cell is in the overdischarge state, an overdischarge determination signal output step S210 for generating and outputting an overdischarge determination signal to the AFE 130 is operated.

At this time, the communication control FET block unit 146 of the MCU 140 senses that an overdischarge determination signal is generated and output and performs a communication control FET block step S220 for blocking the communication control FET 180 on the communication path.

More specifically, the communication control FET block unit 146 senses that an overdischarge determination signal is generated and outputted, generates a communication control FET off signal, and outputs it to the communication control FET 180 to turn off the communication control FET 180. Therefore, it is possible to interrupt the current flow in the communication path between the MCU 140 and the external system 200.

After the communication control FET block step S220 is operated, a discharge FET block step S230 for blocking the discharge current flow to the charge/discharge path between the battery cells 110 and the output terminal 152 is operated.

More specifically, the AFE 130 receiving the overdischarge determination signal from the MCU 140 recognizes it as a command to block the flow of the discharge current, and generates a discharge FET off signal that turns off the discharge FET configured on the charge/discharge path between the battery cells 110 and the output terminal 152 (P−).

At this time, the generated discharge FET off signal is not outputted directly to the discharge FET 170, but after the communication control FET block step S220 is operated, then outputted to turn off the discharge FET 170.

As described above, for example, a configuration such as a delay buffer may be disposed between the AFE 130 and the discharge FET 170, and in the system configuration of the AFE 130, through various methods for outputting it after a predetermined time after the generation of the discharge FET off signal, the discharge FET 170 may be blocked after the predetermined time after the communication control FET 180 is turned off.

That is, during the overdischarge protection operation, the current flow on the communication path is firstly blocked by using the communication control FET 180 before turning off the discharge FET 170 by isolating the communication path with the external system 200, so that after the current is prevented from flowing instantaneously into the communication path, the flow of discharge current is blocked.

Thus, when the discharge FET is turned off in such a way, that is, the surge current generated by interrupting the discharge current flow is prevented from destroying the MCU 140 through the communication path, it is possible to protect the MCU 140, which may further improve the safety of the battery pack.

Here, the predetermined time may be set to, for example, 250 ms.

After the overdischarge protection step S200 of the battery cells operates as described above, an overdischarge release determination step S300 for determining whether the overdischarge protection state is released, that is, the overdischarge is determined to be restored to a normal state, by monitoring the voltage state of each battery cell, and an overdischarge release step S400 for canceling the overdischarge protection operation when it is determined that the overdischarge protection state is released are performed.

After overdischarge protection operation, the MCU 140 determines whether the overdischarge state is released by comparing the voltage state of the battery cells with a predetermined overdischarge determination value (S300).

Therefore, the MCU 140 generates an overdischarge release signal and outputs the overdischarge release signal to the AFE 130, and the AFE 130 receiving it recognizes the flow of the blocked discharge current as a command to release it, and generates and outputs a discharge FET on signal, so that a discharge FET block release step S410 for releasing the discharge FET block is operated.

Meanwhile, the MCU 140 may sense that a discharge FET on signal is outputted, and in order to release a blocked communication path, may release the communication control FET block by generating and outputting the communication control FET on signal. That is, current flow may proceed in the communication path between the MCU 140 and the external system 200 (S420).

Here, as in the overdischarge protection step, there is a certain time interval between the discharge FET control and the communication control FET control.

That is, as the MCU 140 detects the output of the discharge FET ON signal and generates and outputs a communication control FET ON signal, this is because the communication control FET block release step S420 is operated after the discharge FET block release step S410, and the time interval is set in advance so that two steps operate at predetermined time intervals. The predetermined time may be set to, for example, 250 ms.

As a result, it may be described that the overdischarge protection step S200 and the overdischarge release step S320 are operated in reverse order as described above.

More specifically, in the overdischarge protection step S200, after the communication control FET is first turned off (S220), it is configured to turn off the discharge FET (S230) after a predetermined time.

On the other hand, in the overdischarge release step S320, after the discharge FET is first turned on (S322), it is configured to turn on the communication control FET after a predetermined time (S324).

That is, during overdischarge protection, the communication path is firstly isolated/blocked before blocking the discharge current flow, and when the overdischarge is released, the discharge FET is controlled to be turned on so that the discharge current flows, and the current flows in the communication path, so that the surge current generated when the discharge current flows is blocked through the communication path to prevent the MCU 140 from being destroyed.

Through such a step configuration, the discharge FET 170 and the communication control FET 180 are controlled to be in the same state (on/off), and during the discharge current block, the order of turning off is in the order of the communication control FET 180→the discharge FET 170. When the discharge current block is released, turning on is controlled in the order of the discharge FET 170→the communication control FET 180. As the flow of discharge current blocks, it is possible to prevent the surge current from flowing into the battery pack through the communication terminal 150 and adversely affecting the MCU 140, so that a battery pack with improved stability may be provided.

On the other hand, although the technical idea of the present invention is specifically described with reference to the above embodiments, it should be noted that the above embodiments are for the purpose of explanation and not for the purpose of limitation. It will be apparent to those skilled in the art that various modifications and variations may be made in the present invention without departing from the spirit and scope of the invention.

The invention claimed is:

1. A battery pack comprising:
 a cell balancing unit for balancing a plurality of battery cells;
 an analog front end (AFE) for monitoring a voltage state of each of the battery cells and controlling the cell balancing unit;
 a microcomputer unit (MCU) for controlling the AFE based on a voltage state of each battery cell monitored by the AFE; and
 an external terminal connected to the battery pack and an external system,
 wherein the external terminal comprises:
  an output terminal for allowing a current to flow between the battery cell and the external system; and
  a communication terminal for enabling communication between the MCU and the external system,
 wherein the battery pack further comprises:
  a charge field effect transistor (FET) for blocking current flow from the output terminal to the battery cell; and
  a discharge FET for blocking current flow from the battery cell to an output terminal, which are configured on a current path between the battery cell and the output terminal,
  wherein the charge FET and the discharge FET are turned on/off by the AFE, and
  wherein a communication path is formed between the MCU and the communication terminal, and a communication control FET for blocking a path between the communication terminal and the MCU under a control of the MCU is configured on the communication path.

2. The battery pack of claim 1, wherein the MCU comprises:
 an overcharge determination unit for generating an overcharge determination signal and outputting the overcharge determination signal to the AFE, when it is determined that the battery cell is overcharged;
 an overdischarge determination unit for generating an overdischarge determination signal and outputting the overdischarge determination signal to the AFE, when it is determined that the battery cell is overdischarged; and
 a communication control FET block unit for detecting that the overdischarge determination signal outputted from the overdischarge determination unit and outputting a communication control FET off signal to the communication control FET to block a current flow between the MCU and the communication terminal.

3. The battery pack of claim 2, wherein when the overcharge determination signal is inputted from the MCU, the AFE outputs a charge FET off signal to block a flow of a charge current, and when an overdischarge determination signal is inputted, the AFE outputs a discharge FET off signal to block a flow of a discharge current.

4. The battery pack of claim 3, wherein the discharge FET off signal is outputted after a predetermined time after the communication control FET off signal is outputted.

5. A method of controlling a battery pack including battery cells, the method comprising:
 a state determination step of monitoring a voltage state of each battery cell to determine an overcharge or overdischarge state of battery cells, wherein when it is determined that the battery cells are overdischarged in the state determination step, an overdischarge protection step is operated,
 wherein the overdischarge protection step comprises:
  an overdischarge determination signal output step of outputting n overdischarge determination signal to an analog front end (APE) to block a flow of a discharge current;
  a communication control field effect transistor (FET) block step of blocking a communication control FET configured on a communication path between the battery pack and an external system; and a discharge FET block step of blocking a flow of a discharge current from the battery cells to an external terminal.

6. The method of claim 5, further comprising, after the operation of the overdischarge protection step, an overdischarge release determination step of monitoring the voltage state of each battery cell to determine whether overdischarge of battery cells is released, wherein when it is determined that the overdischarge state of the battery cells is released, an overdischarge release step of releasing an overdischarge protection state of the battery cells is operated, wherein the overdischarge release step comprises:

a discharge FET block release step of generating and outputting a FET on signal to release the discharge FET block; and a communication control FET block release step of generating and outputting the communication control FET on signal to release the communication control FET block, wherein the communication control FET block release step is operated a predetermined time after the discharge FET block release step is operated.

7. The method of claim 5, wherein the discharge FET block step is operated a predetermined time after the communication control FET block step is operated.

* * * * *